United States Patent [19]
Amaro et al.

[11] Patent Number: 5,986,888
[45] Date of Patent: Nov. 16, 1999

[54] HEAT SINK FOR AUXILIARY CIRCUIT BOARD

[75] Inventors: Michael Amaro, Naperville; Glynn Russell Ashdown, Lake Bluff; Claude Fernandez, Palatine, all of Ill.

[73] Assignee: Power Trends, Inc., Warrenville, Ill.

[21] Appl. No.: 09/193,926

[22] Filed: Nov. 17, 1998

Related U.S. Application Data

[62] Division of application No. 08/871,235, Jun. 9, 1997.

[51] Int. Cl.⁶ .................................................. H05K 7/20
[52] U.S. Cl. ........................ 361/704; 165/80.3; 174/16.3
[58] Field of Search ................................ 165/80.2, 80.3, 165/185; 174/16.3; 257/712–713, 718–719, 722; 361/688, 690, 704, 707, 709–710, 717–722

[56] References Cited

U.S. PATENT DOCUMENTS

| | | | |
|---|---|---|---|
| 3,219,885 | 11/1965 | Schniers | 361/710 |
| 4,602,315 | 7/1986 | Breese | 361/707 |
| 4,933,746 | 6/1990 | King | 361/718 |
| 5,134,545 | 7/1992 | Smith | 361/720 |
| 5,272,599 | 12/1993 | Koenen | 361/710 |

*Primary Examiner*—Gregory Thompson
*Attorney, Agent, or Firm*—Hill & Simpson

[57] ABSTRACT

The heat sink is mounted on a back plane of an auxiliary circuit board and the auxiliary circuit board is mounted on a main circuit board. In one embodiment, the heat sink is planer and extends between parallel auxiliary and main circuit boards. A finned heat dissipating member is at one side of the planar portion. Mounting pins in channels mount the heat sink to the main circuit board. The second embodiment is u-shaped and stands on edge to mount the auxiliary circuit board perpendicular to the main circuit boards. Mounting pins in channels of the second embodiment likewise mount the heat sink to the main circuit board.

6 Claims, 3 Drawing Sheets

U.S. Patent    Nov. 16, 1999    Sheet 1 of 3    5,986,888
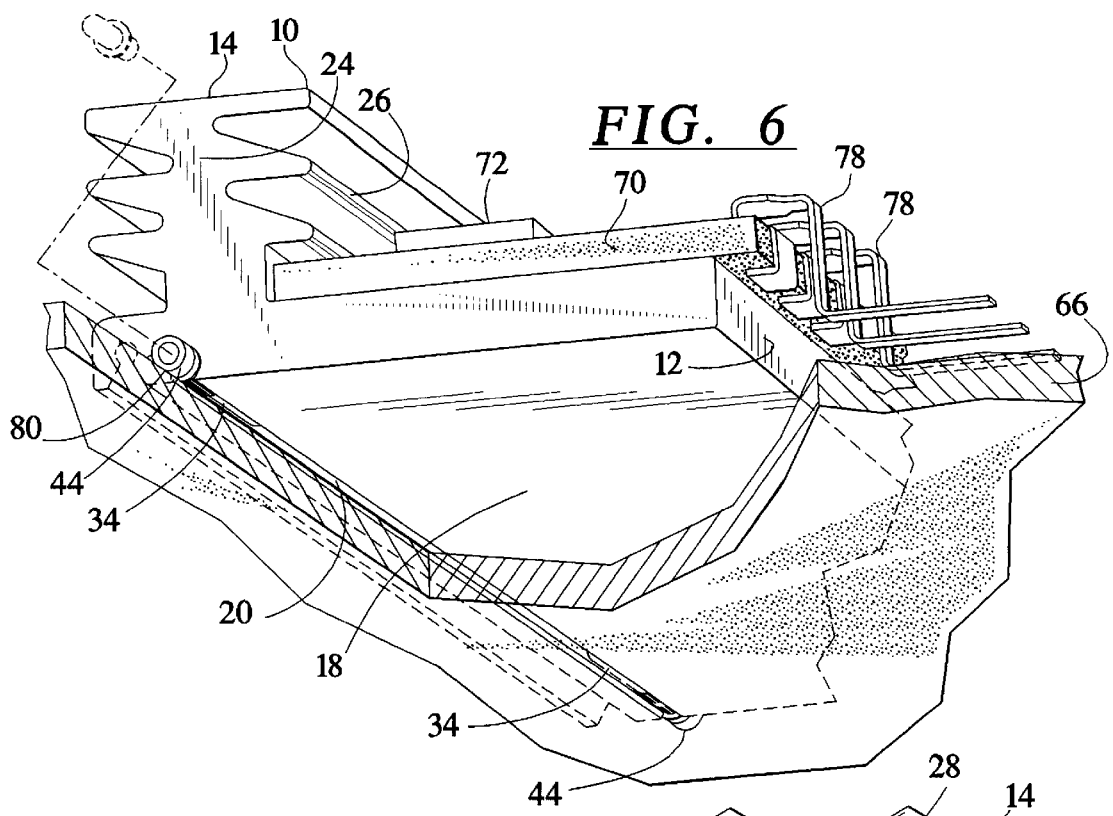
FIG. 6
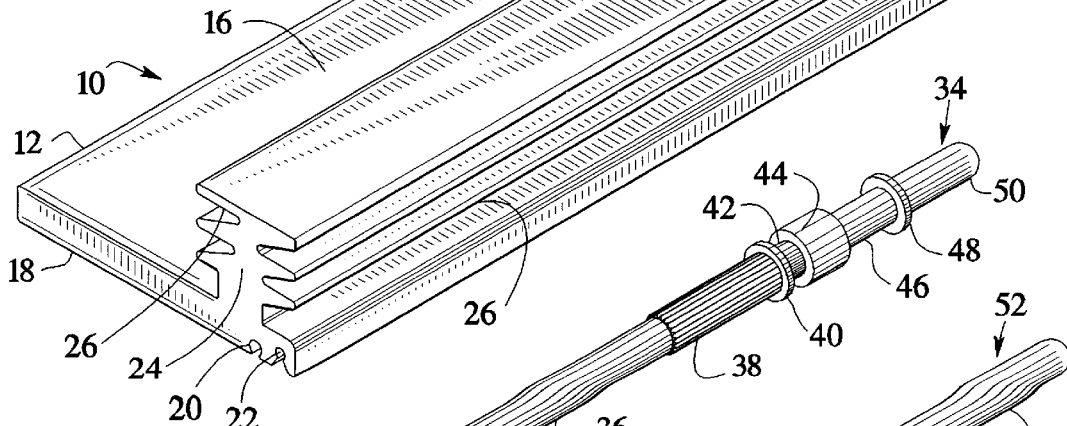
FIG. 1
FIG. 2
FIG. 3

HEAT SINK FOR AUXILIARY CIRCUIT BOARD

This application is a divisional of 08,871,235 filed Jun. 9, 1997.

BACKGROUND OF THE INVENTION

1. Field of the Invention

The present invention relates generally to a heat sink for attachment to the back plane of an auxiliary circuit for use in mounting the auxiliary circuit to a main circuit board.

2. Description of the Related Art

Heat conducting elements for conducting heat away from circuit elements are well known. Such heat conducting elements generally are referred to as heat sinks and are formed of thermally conducting material, such as metal. To increase the surface area of the heat sink, many heat sinks include fins.

SUMMARY OF THE INVENTION

An object of the present invention is to provide a heat sink for mounting on a back surface or back plane of an auxiliary circuit portion which conducts away substantial quantities of heat to permit the auxiliary circuit portion to run cooler even when mounted on a main circuit board.

Another object of the invention is to provide a heat sink for mounting between a circuit board such as an auxiliary circuit board and a mounting surface which is parallel to the auxiliary circuit board which conducts heat away from the auxiliary circuit board.

A further object of the present invention is to provide a heat sink capable of being mounted in a surface mount configuration or being mounted in a pin-through configuration.

These and other objects and advantages of the present invention are provided in a first embodiment by a heat sink having a planar mounting portion for mounting to a back of a circuit portion, such as an auxiliary circuit board, and a finned portion at one side of the planar portion and extending in one perpendicular direction from the planar portion. When positioned between the circuit board and a mounting surface, the heat sink has the planar portion extending between the circuit board and the mounting surface while the finned portion extends perpendicularly from the mounting surface at a side of the circuit board.

The present heat sink is provided with mounting pins for connection to the mounting surface and in a particular development of the invention includes the option of either providing mounting pins for surface mounting or for through-hole mounting with the same heat sink. Specifically, the heat sink includes mounting locations for fitting pins that extend through openings in the mounting surface. The pins extend laterally from the heat sink and are bent downwardly to pass through the openings. Such pins must be fitted high enough on the heat sink to provide space for the bend in the pin. The heat sink also provides a mounting location for surface mounting pins. In particular, the mounting location for the surface mount pins is closer to the main circuit board mounting face of the heat sink than the mounting location for the through-hole mounting.

In one embodiment, the invention provides a generally flat plate for mounting between the back plane of auxiliary circuit and the circuit board on which the auxiliary circuit is mounted. At one edge of the plate is provided a perpendicularly extending heat dissipating structure which includes a central portion or trunk of regularly decreasing widths the further the perpendicular portion extends from the plate. Extending from the central portion or trunk are a plurality of fins or branches which have a base portion extending from the trunk at alternately staggered locations. The fins or branches are of decreasing thickness the further they extend from the central portion or trunk. The trunk and branches thus have a Christmas tree-like structure. This structure encourages effective heat conduction throughout the heat dissipation structure since heat is evenly distributed and no hot spots or cool spots are caused. The top two fins are disposed in a plane that is substantially parallel to the plane of the plate so as to define a top engagement surface for engaging during mounting and handling of the heat sink, either before or after attachment of the auxiliary circuit. Handling of the heat sink may be by use of a vacuum pick up device.

Particular advantage is provided by the heat sink being shaped as an extrusion with consistent dimensions in one direction. In this respect, the openings for the mounting pins are channels extending into the underside of the flat plate for receiving mounting pins which mount the heat sink to the main circuit board.

Mounting pins for mounting the heat sink on the main circuit board provide for either through hole mounting or surface mounting. Two different pin configurations are preferably provided for the two different mounting types. In the pin which is used for surface mounting, a thermal relief is preferably provided on the pin.

Another embodiment of the present heat sink provides a plate for attachment to the back plane of the auxiliary circuit and end plates extending perpendicularly from the back plane plate at each end of the heat sink. The resulting heat sink structure appears similar to three sides of a box which enable it to be mounted free-standing on the main circuit board so that the surfaces thereof are exposed to the airflow for heat dissipation. This second embodiment includes channels for engaging the mounting pins so that the mounting pins may be mounted in the main circuit board in a through hole mounting configuration. The second embodiment of the present heat sink is likewise shaped as an extrusion.

BRIEF DESCRIPTION OF THE DRAWINGS

FIG. 1 is a perspective view of a first embodiment of an extruded heat sink according to the principles of the present invention;

FIG. 2 is a perspective view of a first mounting pin for mounting the heat sink of FIG. 1;

FIG. 3 is a perspective view of a second embodiment of a mounting pin for mounting the heat sink of FIG. 1;

FIG. 6 is a bottom perspective view partially broken away of the heat sink of FIG. 1 surface mounted on a main circuit board;

Figure 5:
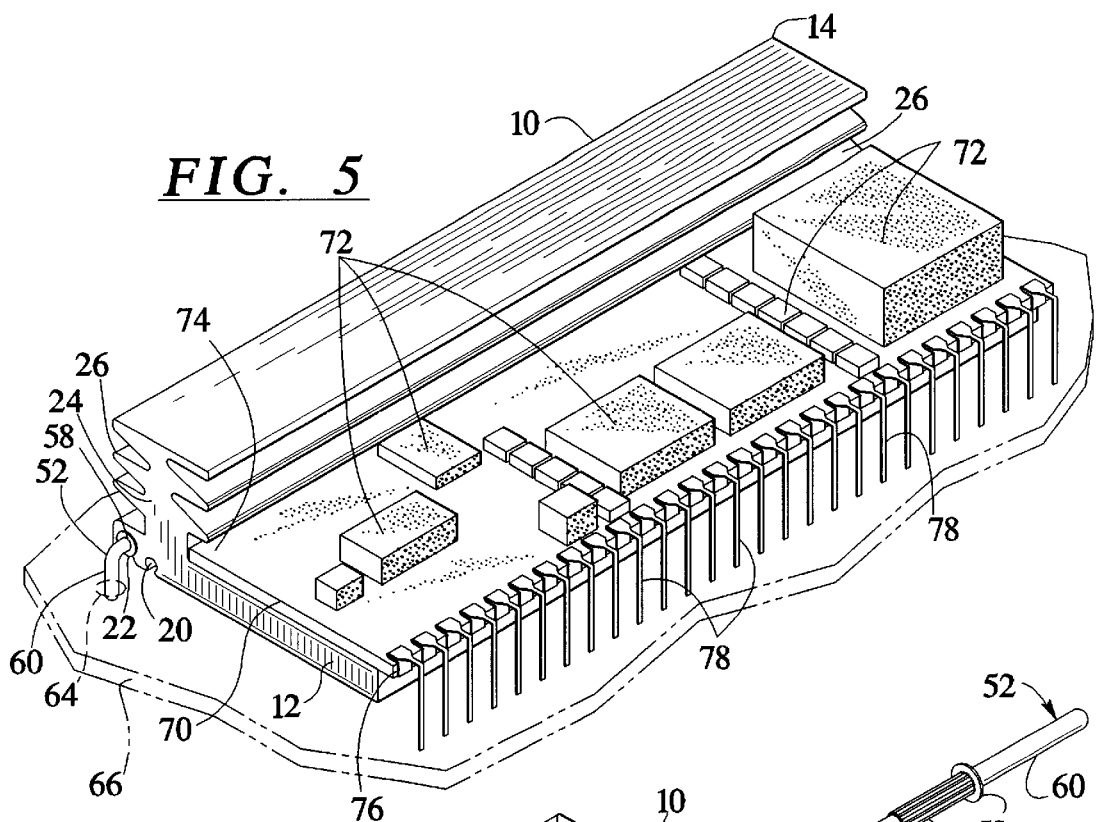
FIG. 5 is a perspective view of the heat sink of FIG. 1 with an auxiliary circuit mounted thereon and mounted for through hole mounting on a main circuit board.

DETAILED DESCRIPTION OF THE
PREFERRED EMBODIMENTS

In FIG. 1 is the first embodiment of the present heat sink 10 which includes a plate 12 and heat dissipation portion 14 which extends perpendicularly from the plate 12. The heat sink 10 is formed by extrusion of a thermally conductive material such as a metal. Preferably, an anodized coating is provided on the surface of the heat sink 10. In one embodiment, the coating is black to increase the heat dissipation. The plate 12 has a top surface 16 for mounting an auxiliary circuit board. The plate 12 also has a bottom surface 18 for mounting on a main circuit board. The preferred embodiment of the present heat sink includes two pin receiving channels 20 and 22.

The heat dissipation member 14 includes a core or trunk 24 which extends upwardly from the plate 12. A plurality of fins 26 extend from the core or trunk 24 on either side thereof. The uppermost fins are shaped to provide a planar engagement surface 28 for engagement by, for example, a vacuum pick-up for handling the sink heat 10 as well as for product marking.

FIGS. 2 and 3 illustrate two examples of solderable mounting pins. The mounting pin 34 of FIG. 2 is in the form of a cylindrical shaft having a smooth end portion 36 which leads to a fluted surface portion 38 that extends to a stop ring 40. The smooth end portion 36 is inserted first into the channels on the lower side of the heat sink and the pin is pressed in so that the fluted portion 38 engages the inner surface of the channel 20. The pin 34 is inserted into the channel until the stop ring 40 contacts the end of the heat sink. Adjacent the stop ring 40 is thermal relief portion 42 that connects to a solder connection ring 44. Extending from the solder connection ring 44 is a continuation of the pin shaft 46, followed by second stop ring 48 and an end portion 50. When used for surface mounting in the first embodiment of the heat sink 10, the portions 46, 48 and 50 of the pin may be cut off. The solder connection ring 44 is soldered to the surface of the main circuit board. The thermal relief 42 is a portion of the pin of a reduced diameter, being at least reduced in diameter relative to the surface mounting ring 44, which inhibits heat flow from the solder connection ring 44 to the heat sink 10 so that the solder process does not have to raise the mass of the heat sink 10 to solder reflow temperature to form the solder connection.

The pin of FIG. 2 may also be used in a through pin mounting configuration in the second embodiment, as will be discussed later.

In FIG. 3 is shown a version of the mounting pin 52 which is used for through hole mounting. The pin 52 has the smooth end portion 54 with a fluted portion 56 and a stop ring 58. As with the previously described embodiment, the end portion 54 is inserted into the channel 22 of the heat sink so that the fluted portion 36 engages the inside surface of the channel to securely hold the pin in place. The pin is inserted up to the stop ring 58. An end portion 60 is then bent at, for example, a 90° angle for insertion through a through hole in the main circuit board. The end portion 60 has no stop rings so that it may be easily bent into shape.

Figure 4:
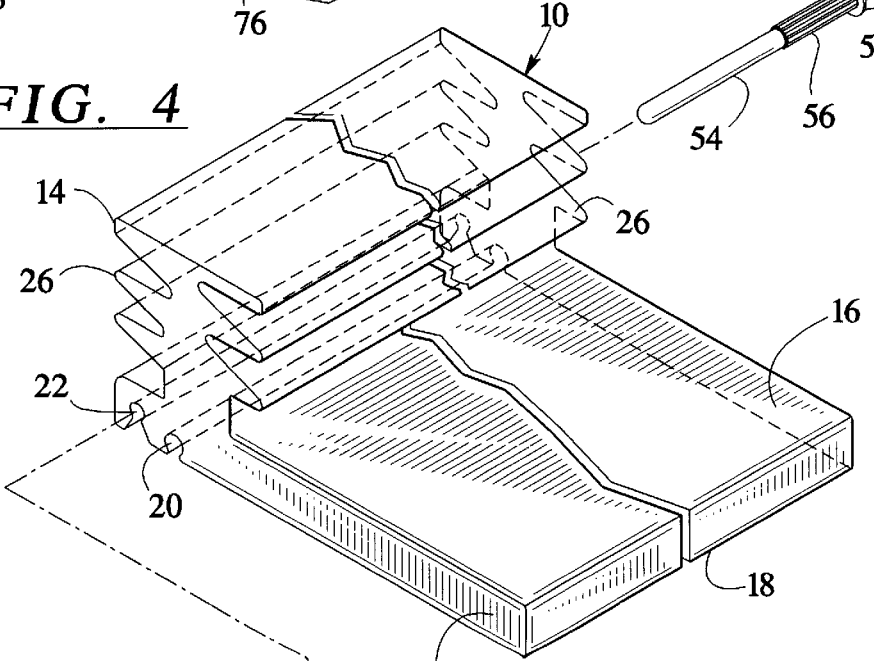
FIG. 4 is an exploded perspective view partially in phantom of the heat sink of FIG. 1 including the mounting pins of FIG. 3.

Referring to FIG. 4, the heat sink 10 is being provided with the mounting pins 52. The portion 54 of the pins is inserted into the channel 22. As indicated in phantom, the channel 22 extends for the full width of the heat sink 10 so that it is possible to insert the pins 52 into both ends of the channel 22. It is noted that the channel 22 is higher above the bottom surface 18 of the heat sink than the channel 20. This provides clearance for the radius of the bend in the mounting pin 52. After being inserted into the channel 22, the end portion 60 of the mounting pin is bent downward at approximately a 90° angle.

In FIG. 5 is shown the heat sink 10 with the mounting pin 52 inserted into the channel 22 up to the stop ring 58 and the portion 60 bent at approximately a 90° angle to extend through an opening 64 in a main circuit board 66. The pin 52 at the other side of the heat sink 10 is similarly inserted, bent to a 90° angle, and positioned in a through hole in the main circuit board 66 as well.

FIG. 5 also shows an auxiliary circuit board 70 having circuit components 72 on a component side of the circuit board. The auxiliary circuit 70 has its backplane, which is opposite the component side, mounted against the top surface 16 of the plate 12 of the present heat sink. A thermally conductive adhesive, for example, may be used to secure the auxiliary circuit 70 to the heat sink 10. One edge of the auxiliary circuit 70 is positioned against the central portion 24 of the heat dissipation member 14 such that it is beneath the lower-most one of the fins 26. An opposite edge 76 of the auxiliary circuit is provided with a plurality of electrical connecting pins 78 for communication with the circuit composed of the components 72. The pins 78 are bent generally at a 90° angle and extend downwardly through openings in the main circuit board 66 where they are connected by solder. The mounting pins 52 may be soldered in place to secure the heat sink 10 to the main circuit board 66. If desired, a reference voltage, such as ground, may be electrically connected to the mounting pins 52 so that the heat sink is maintained at the reference voltage rather than accumulating stray voltages from the auxiliary circuit. Other means for connecting the mounting pins to the main circuit board 66 are contemplated as well.

Not only does the heat sink mount the auxiliary circuit board in a through hole configuration as shown in FIG. 5, but, as illustrated in FIG. 6, the heat sink may be mounted in a surface mount configuration. The auxiliary circuit board 70 is positioned on the top surface of the plate 12 as before. However, the connecting pins 78 are shaped with an additional bend to extend horizontally to the main circuit board 66 and thereby lie against the surface of the main circuit board where they are soldered in place, as is well known for surface mounting of electronic circuits. Compared to the through-hole mounting, the surface mounting embodiment shown in FIG. 6 differs in that the mounting pin 34 as shown in FIG. 2 is used instead and it is inserted into the lower channel 20 of the heat sink. The channel 20 positions the pin 34 closer to the surface of the main circuit board 66 than does the higher channel 22. This enables the solder connection ring 44 to lie against the top surface of the main circuit board 66 where it is soldered in place, for example, by solder 80 and is visible for inspection of the solder joint. Two such pins 34 are provided for mounting the heat sink 10 to the main circuit board 66, one being provided at each end of the channel 20. The reduced diameter thermal relief portion 42 of the mounting pin allows the pin to rise to solder reflow temperature without requiring heating of the heat sink. The smaller diameter portion 42 cannot conduct as much heat as a larger diameter part of the pin.

Figure 7:
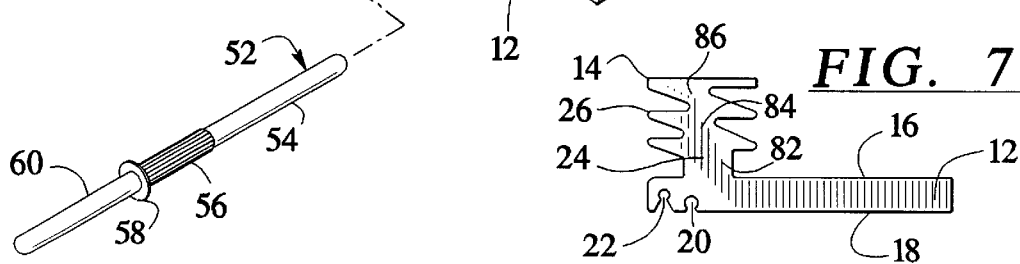
FIG. 7 is an in-view of the first embodiment of the heat sink from an extruding direction.

Referring to FIG. 7, the core 24 of the heat dispersing portion 14 is thicker at the part 82 adjacent the plate 12, is thinner at the part 84 midway along its height and is thinner still at the part 86 near the top. This changing thickness optimizes heat flow throughout the height of the heat dispersing element 14 to provide the most effective heat dissipation. The fins 26 at the bottom are shorter than the fins at the top. The fins 26 connect to the central core 24 at staggered locations rather than being connected at positions opposite one another. This is accomplished by the sloping surfaces of the heat dispersing fins 26. This arrangement of the fins 26 allows heat to flow evenly up the structure for the most effective heat dispersion throughout all of the fins. These features provide the same heat dissipation performance in the present heat sink as in a larger heat sink.

Figure 8:
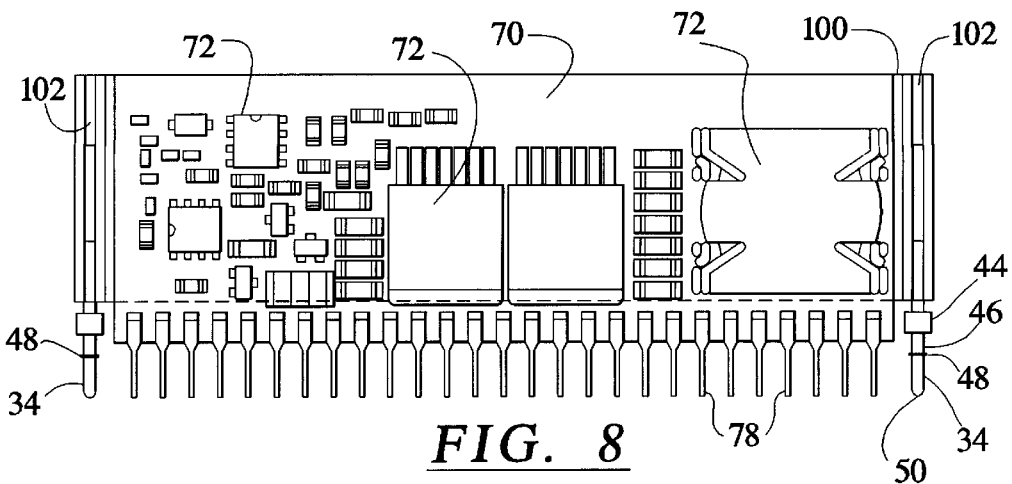
FIG. 8 is a front elevational view of a second embodiment of a heat sink according to the present invention.

Referring to FIG. 8, a second embodiment of a heat sink 100 is shown to which the auxiliary circuit board 70 is mounted. The auxiliary circuit board 70 includes the circuit components 72 on the front of the auxiliary circuit board 70 and the back plane of the auxiliary circuit board 70 is mounted to the heat sink 100. The connecting pins 78 extend from the lower edge of the auxiliary circuit board for connection to a main circuit.

The second embodiment of the heat sink 100 enables the auxiliary circuit board 70 to be mounted to a main circuit board in a position substantially perpendicular thereto. The heat sink 100 has pin engaging channels 102 which are at opposite ends of the auxiliary circuit board 70. In the pin engaging channels are inserted the mounting pins 34. The mounting pins 34 are inserted into the channels 102 from a direction to enable them to extend through openings in a main circuit board into which the circuit connecting pins 78 are inserted. The stop rings 48 on the mounting pins 34 provide a positive stopping point for the insertion of the pins 34 into the circuit board and thereby support the auxiliary circuit board 70 in the vertical position.

Figures 9, 10:
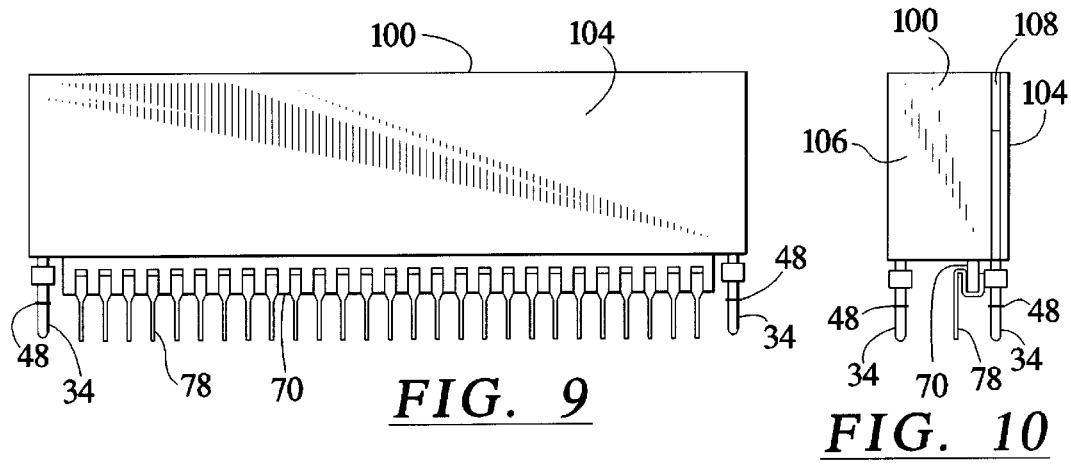
FIG. 9 is a back elevational view of the second embodiment of FIG. 8.
FIG. 10 is an end view of the heat sink of FIG. 8.

In FIG. 9, the second embodiment of the heat sink 100 is shown from the back. In this view, only the lower edge of the auxiliary circuit board 70 is visible with the circuit connecting pins 78 extending therefrom. The back of the heat sink 100 is a flat heat dissipating surface without the pin mounting channels.

An end view is shown in FIG. 10 wherein the heat sink 100 has the back surface 104 for heat dissipation as well as side surfaces 106 for heat dissipation. In the side surface 106 is a channel 108 into which is inserted one of the mounting pins 34. The mounting pins 34 are at opposite sides of the side wall 106 to provide front to back stability for the vertically mounted auxiliary circuit board 70. The stop rings 48 on the mounting pins 34 provide a pre-defined mounting plane for the heat sink 100.

Figure 11:
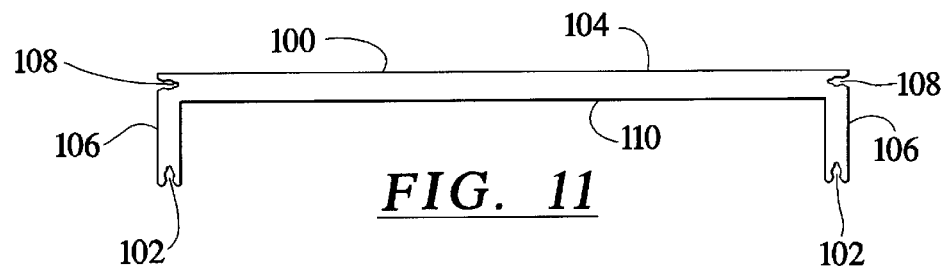
FIG. 11 is a top plan view of the heat sink of FIG. 8.

In FIG. 11 is seen a top view of the heat sink 100 including the back wall 104 which is seen in FIG. 9 and the side wall 106 which is seen in FIG. 10. Also visible in FIG. 11 is the circuit board mounting surface 110 to which the auxiliary circuit board 70 is attached. The pin receiving channels 108 are at opposite ends of the back wall of the heat sink 100 and the pin receiving channels 102 are at the free ends of the side walls. The overall shape of the second embodiment of the heat sink 100 permits it to be extruded so that manufacture is considerably cheaper than non-extruding heat sink. The same mounting pins 34 are used in the second embodiment of the heat sink 100 as are used in the first embodiment when a surface mounting is desired. Like the first embodiment, the second embodiment of the heat sink is of a thermally conductive metal which may be anodized and is preferably of a black color. The auxiliary circuit board 70 is preferably mounted in place by a thermally conductive adhesive.

Figure 12:
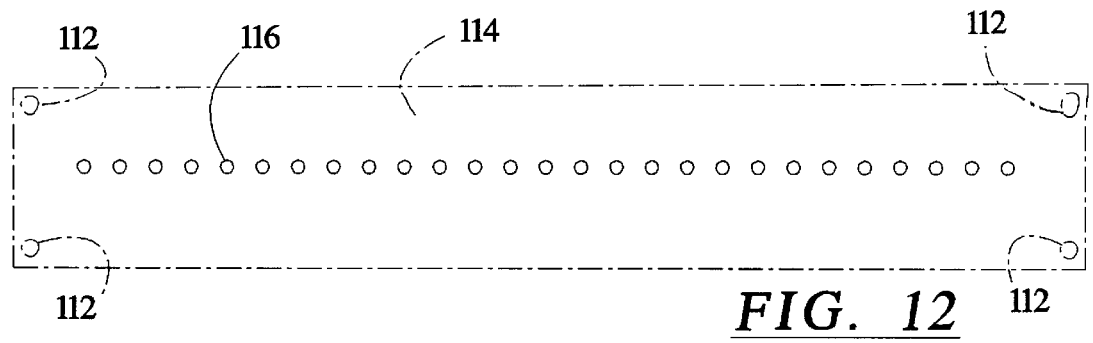
FIG. 12 is a plan view of the pin-out arrangement for the heat sink of the second embodiment.

FIG. 12 is a schematic view of the pin-out configuration for the second embodiment of the heat sink 100. The pin-out is not shown to scale with the views of FIGS. 8–11. The pin-out configuration is the arrangement of mounting holes in a main circuit board which are required for mounting the heat sink of FIGS. 8–11. In the pin-out arrangement, larger diameter openings 112 are provided at the corners of the rectangular space 114 and a series of smaller openings 116 is arranged in a line within the rectangular space 114. The line of smaller openings 116 extends along the longest dimension of the rectangular space 114 and somewhat closer to one long side than the other. The smaller openings 116 receive these circuit connecting pins 78 of the auxiliary circuit board 70, while the corner openings 112 receive the mounting pins 34 which are in the channels 102 and 108 of the heat sink 100.

Thus, there is shown and described embodiments of a heat sink and mounting pins for mounting an auxiliary circuit either substantially parallel to a main circuit with a through hole configuration or surface mount configuration or for mounting the auxiliary circuit perpendicular to the main circuit. Heat is conducted from the auxiliary circuit away from the back plane thereof and to a heat dispersing structure which is structured to provide the most effective thermal conduction throughout the structure for efficient dissipation of the heat. The heat sink is shaped for formation by extrusions so that manufacturing costs are kept low and is readily adapted to either through hole mounting or surface mounting by selecting the appropriate pins.

The present heat sink may also be used for mounting individual circuit components instead of the auxiliary circuit board.

Although other modifications and changes may be suggested by those skilled in the art, it is the intention of the inventors to embody within the patent warranted hereon all changes and modifications as reasonably and properly come within the scope of their contribution to the art.

We claim:

1. A heat sink for an auxiliary circuit to be mounted on a main circuit board, comprising:

a planar back member having pin receiving channels formed in said back member at two opposite ends thereof, said pin receiving channels extending in a plane of said planar back member, said back member defining an auxiliary circuit mounting surface;

end plate members extending perpendicularly from said planar back member at said two opposite ends, said end plate members each having a pin receiving channel at an end opposite said back member;

said planar back member and said end plate members being formed in one piece by extrusion; and mounting pins extending into said pin receiving channels so that mounting portions extend from said pin receiving channels for engagement into the main circuit board.

2. A heat sink for an auxiliary circuit to be mounted on a main circuit board, comprising:

a planar back member having a major surface defining an auxiliary circuit mounting surface, said planar back member having two opposite ends;

end plates extending perpendicularly from said planar back member at said two opposite ends, said end plates being parallel to one another;

pin receiving channels formed in at least one of said planar back member and said end plates, said pin receiving channels extending parallel to said end plates, said pin receiving channels each being open at ends of said pin receiving channel at edges of said at least one of said planar back member and said end plates, each of said channels extending entirely across a respective one of said at least one of said planar back member and said end plates;

said planar back member and said end plates and said pin receiving channels being formed by extrusion; and mounting pins mounted in said pin receiving channels and each having an end extending from said pin receiving channels for engagement with the main circuit board.

3. A heat sink as claimed in claim 2, wherein said end plates extend in a same direction from said planar back member.

4. A heat sink as claimed in claim 2, wherein two of said pin receiving channels are formed in each of said end plates.

5. A heat sink as claimed in claim 2, wherein said mounting pins include a first portion mounted in said pin receiving channels and said end extending from said pin receiving channel and an enlargement between said first portion and said end.

6. A heat sink as claimed in claim 5, wherein said first portion has a fluted surface on at least a portion thereof.

* * * * *